(12) United States Patent
Hu et al.

(10) Patent No.: US 6,611,047 B2
(45) Date of Patent: Aug. 26, 2003

(54) SEMICONDUCTOR PACKAGE WITH SINGULATION CREASE

(75) Inventors: Tom Hu, Gilbert, AZ (US); Terry W. Davis, Gilbert, AZ (US); Ludovico Bancod, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/976,866

(22) Filed: Oct. 12, 2001

(65) Prior Publication Data

US 2003/0073265 A1 Apr. 17, 2003

(51) Int. Cl.[7] .................. H01L 23/495; H01L 23/04; H01L 23/28
(52) U.S. Cl. ...................... 257/666; 730/787
(58) Field of Search ................ 257/666, 667, 257/668, 669, 670, 671, 672, 673, 674, 676, 677, 678, 730, 787; 29/835, 838

(56) References Cited

U.S. PATENT DOCUMENTS

| | | | |
|---|---|---|---|
| 3,838,984 A | 10/1974 | Crane et al. | |
| 4,054,238 A | 10/1977 | Lloyd et al. | |
| 4,530,152 A | 7/1985 | Roche et al. | |
| 4,707,724 A | 11/1987 | Suzuki et al. | |
| 4,756,080 A | 7/1988 | Thorp, Jr. et al. | |
| 4,812,896 A | 3/1989 | Rothgery et al. | |
| 5,029,386 A | * 7/1991 | Chao et al. ........... | 29/827 |
| 5,041,902 A | 8/1991 | McShane | |
| 5,157,480 A | 10/1992 | McShane et al. | |
| 5,172,213 A | 12/1992 | Zimmerman | |
| 5,172,214 A | 12/1992 | Casto | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,221,642 A | 6/1993 | Burns | |

(List continued on next page.)

FOREIGN PATENT DOCUMENTS

| | | |
|---|---|---|
| DE | 19734794 A1 | 8/1997 |
| EP | 0794572 A2 | 10/1997 |
| JP | 5745959 | 3/1982 |
| JP | 59227143 | 12/1984 |
| JP | 60195957 | 10/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 692076 | 4/1994 |
| JP | 7312405 | 11/1995 |
| JP | 8125066 | 5/1996 |
| JP | 8306853 | 11/1996 |
| JP | 98205 | 1/1997 |

(List continued on next page.)

*Primary Examiner*—Kamand Cuneo
*Assistant Examiner*—Scott B. Geyer
(74) *Attorney, Agent, or Firm*—Stetina Brunda Garred & Brucker

(57) ABSTRACT

An integrated circuit chip package comprising a lead frame having an integrated circuit die electrically connected thereto. Partially encapsulating the lead frame and the integrated circuit die is a package body. The package body includes the central portion which is circumvented by a peripheral portion defining opposed top and bottom surfaces. Disposed in at least one of the top and bottom surfaces of the peripheral portion of the package body is a singulation crease. The singulation crease, which is formed in the package body during its molding process, is used to provide a stress concentration line which reduces stress along the edge of the chip package and avoids chipping and cracking problems during the punch singulation process used to complete the manufacture of the same.

14 Claims, 8 Drawing Sheets

U.S. PATENT DOCUMENTS

| | | | |
|---|---|---|---|
| 5,258,094 A | 11/1993 | Furui et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,332,864 A | 7/1994 | Liang et al. | |
| 5,336,931 A | 8/1994 | Juskey et al. | |
| 5,343,076 A | 8/1994 | Katayama et al. | |
| 5,406,124 A | 4/1995 | Morita et al. | |
| 5,410,180 A * | 4/1995 | Fujii et al. | 257/666 |
| 5,424,576 A | 6/1995 | Djennas et al. | |
| 5,435,057 A | 7/1995 | Bindra et al. | |
| 5,474,958 A | 12/1995 | Djennas et al. | |
| 5,521,429 A | 5/1996 | Aono et al. | |
| 5,604,376 A | 2/1997 | Hamburgen et al. | |
| 5,608,267 A | 3/1997 | Mahulikar et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,646,831 A | 7/1997 | Manteghi | |
| 5,650,663 A | 7/1997 | Parthasaranthi | |
| 5,683,806 A | 11/1997 | Sakumoto et al. | |
| 5,696,666 A | 12/1997 | Miles et al. | |
| 5,701,034 A | 12/1997 | Marrs | |
| 5,710,064 A | 1/1998 | Song et al. | |
| 5,736,432 A | 4/1998 | Mackessy | |
| 5,776,798 A | 7/1998 | Quan et al. | |
| 5,783,861 A | 7/1998 | Son | |
| 5,835,988 A | 11/1998 | Ishii | |
| 5,859,471 A | 1/1999 | Kuraishi et al. | |
| 5,866,939 A | 2/1999 | Shin et al. | |
| 5,877,043 A | 3/1999 | Alcoe et al. | |
| 5,886,398 A * | 3/1999 | Low et al. | 257/667 |
| 5,894,108 A | 4/1999 | Mostafazadeh et al. | |
| 5,977,613 A | 11/1999 | Takata et al. | |
| 5,977,630 A | 11/1999 | Woodworth et al. | |
| 5,981,314 A | 11/1999 | Glenn et al. | |
| 5,986,885 A | 11/1999 | Wyland | |
| 6,001,671 A | 12/1999 | Fjelstad | |
| 6,025,640 A | 2/2000 | Yagi et al. | |
| 6,072,228 A | 6/2000 | Hinkle et al. | |
| 6,130,115 A | 10/2000 | Okumura et al. | |
| 6,130,473 A | 10/2000 | Mostafazadeh et al. | |
| 6,140,154 A | 10/2000 | Hinkle et al. | |
| 6,143,981 A | 11/2000 | Glenn | |
| 6,184,465 B1 * | 2/2001 | Corisis | 174/52.4 |
| 6,198,171 B1 | 3/2001 | Huang et al. | |
| 6,225,146 B1 | 5/2001 | Yamaguchi et al. | |
| 6,229,200 B1 * | 5/2001 | Mclellan et al. | 257/666 |
| 6,242,281 B1 | 6/2001 | Mclellan et al. | |
| 6,281,568 B1 | 8/2001 | Glenn et al. | |
| 6,294,100 B1 | 9/2001 | Fan et al. | |
| 6,444,499 B1 | 9/2002 | Swiss et al. | |
| 6,464,121 B2 * | 10/2002 | Reijnders | 225/103 |
| 6,563,209 B1 * | 5/2003 | Takahashi | 257/692 |

FOREIGN PATENT DOCUMENTS

| | | |
|---|---|---|
| JP | 98206 | 1/1997 |
| JP | 98207 | 1/1997 |
| JP | 992775 | 4/1997 |
| KR | 941979 | 1/1994 |
| KR | 9772358 | 11/1997 |

\* cited by examiner

SEMICONDUCTOR PACKAGE WITH SINGULATION CREASE

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to integrated circuit chip package technology, and more particularly to an integrated circuit chip package formed to include one or more singulation creases adapted to minimize occurrences of chipping and cracking during the chip package manufacturing process.

As is well known in the electrical arts, integrated circuit dies are conventionally enclosed in plastic packages that provide protection from hostile environments and enable electrical interconnection between the integrated circuit die and a substrate such as a printed circuit board or PCB. The elements of the package typically include a metal lead frame, an integrated circuit die, a bonding material used to attach the integrated circuit die to the lead frame, bond wires which electrically connect pads on the integrated circuit die to respective, individual leads or contacts of the lead frame, and a hard plastic encapsulant material which covers the other components and forms the predominant portion of the exterior of the package.

In the chip package, the lead frame is the central supporting structure thereof. A conventional lead frame includes a die pad for accommodating the integrated circuit die, and a plurality of leads or contacts. In many varieties of integrated circuit chip packages, each bond pad provided on the die is wire-bonded to a respective contact, with portions of the contacts being exposed within the plastic encapsulant or package body and used to mount or electrically connect the chip package to the printed circuit board. In addition to portions of the leads or contacts being exposed, in certain chip packages, one surface of the die pad is also exposed for purposes of providing a thermally conductive path to dissipate heat from the integrated circuit die which is attached to the opposed surface of the die pad and is internal to the package, i.e., surrounded by the plastic encapsulant.

There is known in the prior art methodologies for simultaneously constructing a plurality of the above-described chip packages. In an exemplary methodology, a matrix of interconnected lead frames are etched into a lead frame strip. Subsequent to the attachment of the dies to respective ones of the die pads and electrical connection of the dies to respective ones of the contacts, an encapsulation step facilitates the application of an encapsulant material onto the surface of the lead frame strip to which the dies are attached. This encapsulation step covers the dies, the side surfaces of the die pads, and portions of the contacts within a single block of encapsulant material. The encapsulant material is then hardened, with a cutting step thereafter being used to separate individual chip packages from each other and from the disposable portions of each of the lead frames within the lead frame strip. The cutting step severs the connection between each of the interconnected lead frames within the lead frame strip, and the die pad and contacts of each individual lead frame. This cutting or "singulation" process is typically accomplished either via a punching process (punch singulation) or a sawing process (saw singulation).

With particular regard to a punch singulation process, one of the drawbacks associated with the use of this cutting process is the tendency for the hardened encapsulant material or package body of the chip package to chip or crack as a result of the punching operation. As will be recognized, such chipping or cracking of the chip package can result in the accelerated failure thereof as a result of, among other things, moisture permeation to the embedded integrated circuit die. The present invention addresses the chipping and cracking problem associated with the punch singulation process by forming pre-scores or creases in the package body of the chip package to provide a stress concentration line prior to the punch singulation process. The inclusion of this stress concentration line allows for smooth singulation along the singulation crease, thereby reducing stress on the edge of the chip package and avoiding the aforementioned chipping and cracking problems.

BRIEF SUMMARY OF THE INVENTION

In accordance with the present invention, there is provided an integrated circuit chip package comprising a lead frame having an integrated circuit die electrically connected thereto. Partially encapsulating the lead frame and the die is a package body which includes a central portion circumvented by a peripheral portion defining opposed, generally planar top and bottom surfaces. Molded or formed into at least one of the top and bottom surfaces of the peripheral portion of the package body is a pre-score or singulation crease. It is contemplated that a single singulation crease may be disposed in the top surface of the peripheral portion of the package body, or that a pair of singulation creases may be disposed in respective ones of the top and bottom surfaces of the peripheral portion in opposed relation to each other. In the chip package, the lead frame includes a plurality of contacts and tie bars which extend within the peripheral portion of the package body, and are partially exposed within the bottom surface of the peripheral portion. It is contemplated that the bottom singulation crease of the pair may be collectively defined by a plurality of singulation crease segments disposed within the bottom surface of the peripheral portion and the exposed surfaces of the contacts and tie bars. In this regard, the lead frame is formed to include the singulation crease segments within prescribed surfaces of the contacts and tie bars. The singulation crease(s) are formed within the package body during its molding process, and are used to form a stress concentration line which allows for smooth singulation therealong, thus creating less stress on the edge of the chip package during the punch singulation process and avoiding the chip and crack problems discussed above.

The depth and cross-sectional configuration of the singulation crease(s) are variable. One presently contemplated cross-sectional configuration is wedge-shaped or triangular, with one contemplated depth of a single singulation crease formed in the top surface of the peripheral portion being approximately one-half of the thickness of the peripheral portion. In a chip package including an opposed pair of singulation creases, it is contemplated that the depth of such creases is such that a web is defined therebetween having a thickness which is approximately one-half of the thickness of the lead frame.

Further in accordance with the present invention, there is provided a method of forming an integrated circuit chip package. The method comprises the initial step of electrically connecting an integrated circuit die to a lead frame, and thereafter partially encapsulating the lead frame and the integrated circuit die with a package body having the above-described structural attributes and including the singulation crease(s). In the forming process, the package body is singulated along the singulation crease subsequent to being clamped in a manner wherein at least a portion of the singulation crease is exposed. If a single singulation crease is formed or molded into the top surface of the peripheral portion of the package body, the punch used in the punch singulation process will initially impact the top surface of the peripheral portion. Conversely, if an opposed pair of singulation creases are included in the peripheral portion, the punch will preferably initially impact the bottom surface of the peripheral portion. The initial impact on the top surface in the case of a single singulation crease being formed in the package body is to minimize the disturbance to the leads or contacts of the lead frame, portions of which are exposed within the bottom surface of the peripheral portion as indicated above.

The present invention is best understood by reference to the following detailed description when read in conjunction with the accompanying drawings.

BRIEF DESCRIPTION OF THE DRAWINGS

These, as well as other features of the present invention, will become more apparent upon reference to the accompanying drawings wherein.

Common reference numerals are used throughout the drawings and detailed description to indicate like elements.

DETAILED DESCRIPTION OF THE INVENTION

Figure 1:
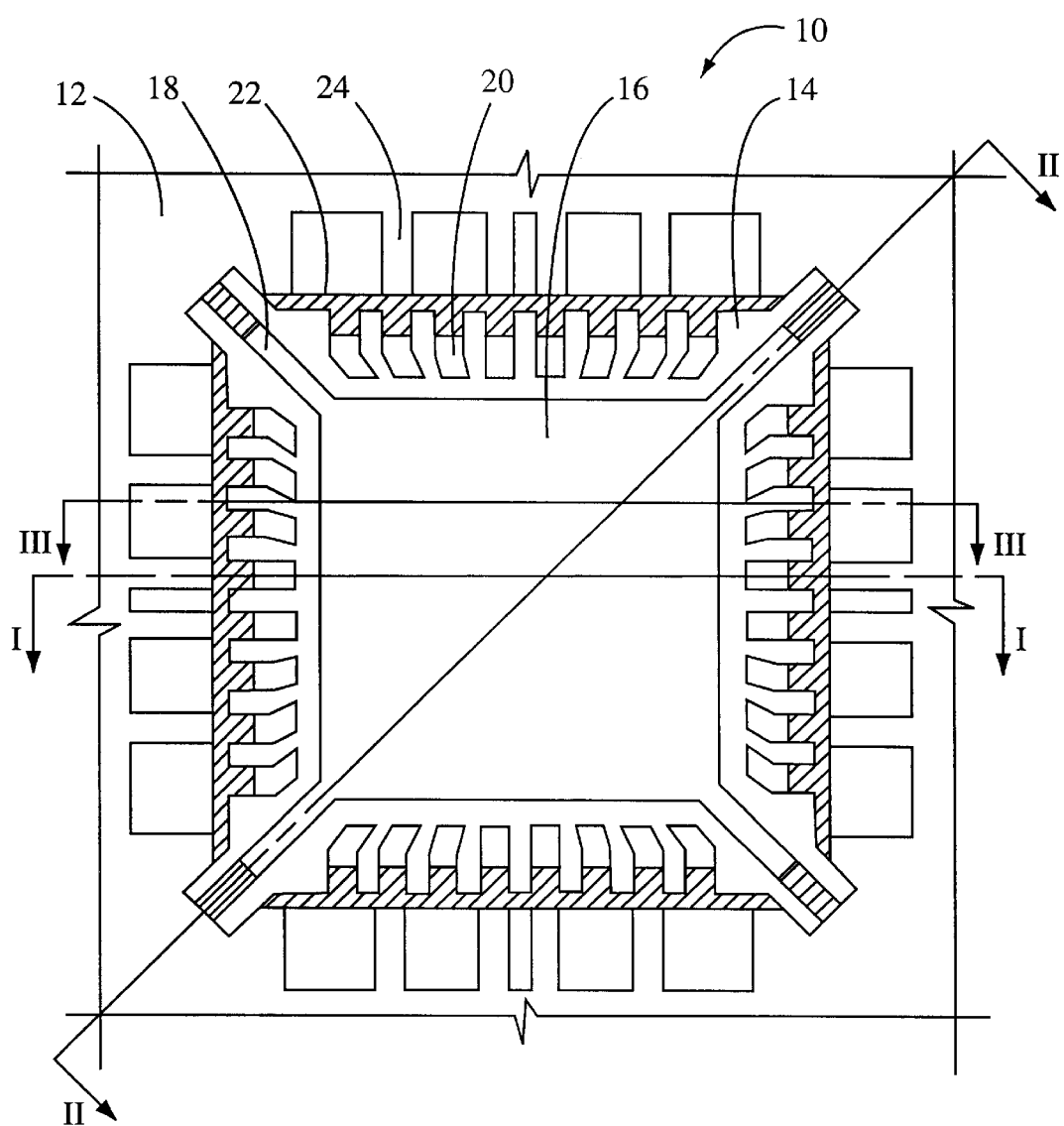
FIG. 1 is a top plan view of the lead frame of an integrated circuit chip package constructed in accordance with the present invention prior to the punch singulation thereof from a metal strip.
Figure 2:
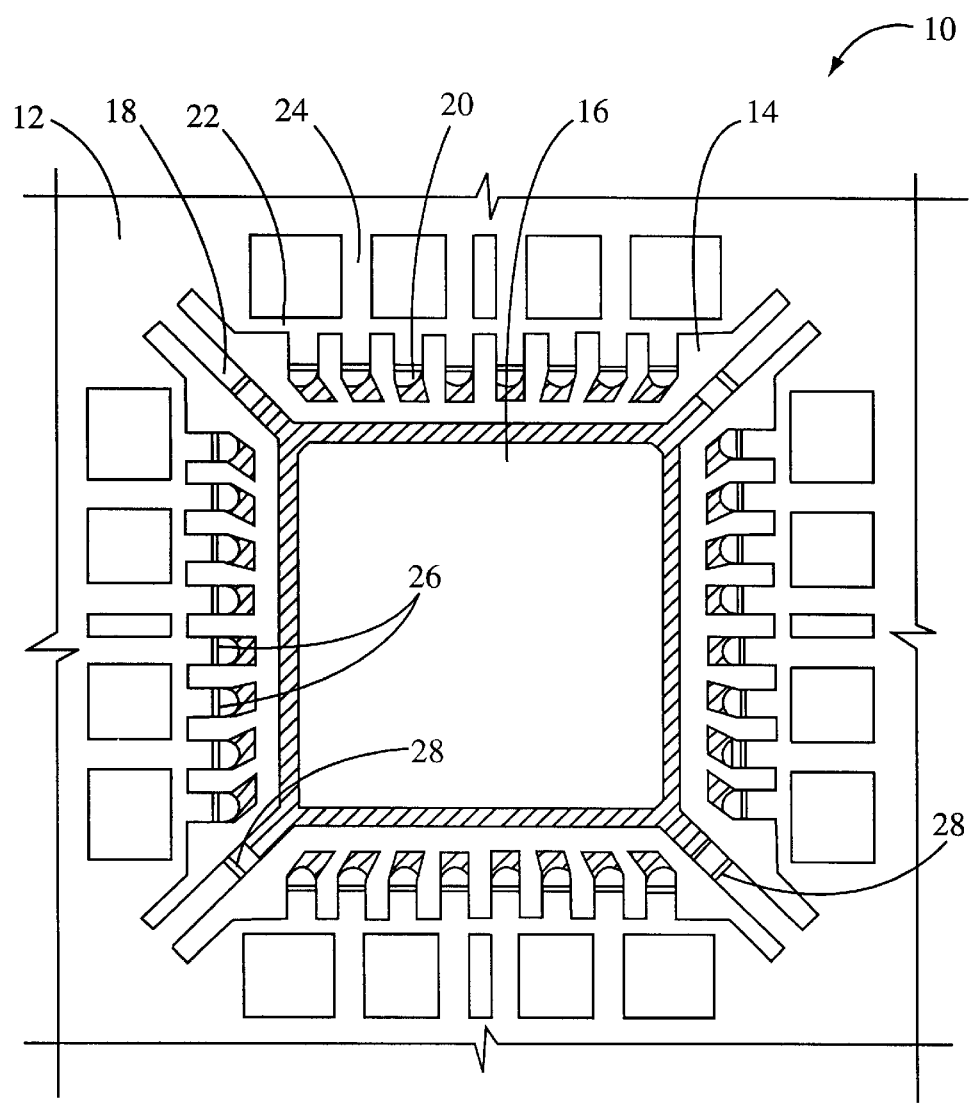
FIG. 2 is a bottom plan view of the lead frame shown in FIG. 1.

Referring now to the drawings wherein the showings are for purposes of illustrating preferred embodiments of the present invention only, and not for purposes of limiting the same, FIGS. 1 and 2 depict top and bottom plan views, respectively, of a lead frame 10 used in an integrated circuit chip package 100 (shown in FIG. 11) constructed in accordance with the present invention. The lead frame 10 comprises a frame 12 which is a substantially planar plate defining a centrally located space 14. Disposed within the space 14 is a die pad 16 of the lead frame 10. The die pad 16 is a substantially square plate which is connected to the frame 12 by a plurality of tie bars 18. As seen in FIGS. 1 and 2, four tie bars 18 are used to connect the die pad 16 to the frame 12, with the tie bars 18 extending from respective ones of the four corner regions defined by the die pad 16. The tie bars 18 facilitate the stable support of the die pad 16 within the frame 12, and more particularly the space 14 defined thereby.

The lead frame 10 further comprises a multiplicity of leads or contacts 20 which protrude from the frame 12 into the space 14 toward the peripheral edge of the die pad 16. In FIGS. 1 and 2, a total of thirty-two contacts 20 are shown as being included in the lead frame 10, with the contacts 18 being segregated into four sets of eight, and each set of eight being disposed in spaced relation to a respective one of the four peripheral edge segments defined by the die pad 16. Each of the contacts 20 is connected to and extends perpendicularly from a dambar 22, the opposed ends of which are connected to the frame 12. A total of four dambars 22 are included in the lead frame 10, with each set of eight contacts 20 extending from a respective dambar 22. Each dambar 22 is further connected to the distal ends of a plurality of supporting leads 24, with the opposed ends of the supporting leads 24 themselves being connected to the frame 12. Thus, the contacts 20 are supported in a stable manner in the space 14 defined by the frame 12 by the dambars 22 and the corresponding supporting leads 24. As indicated above, the free, distal ends of the contact 20 are disposed in spaced relation to the peripheral edge of the die pad 16.

Figure 3:
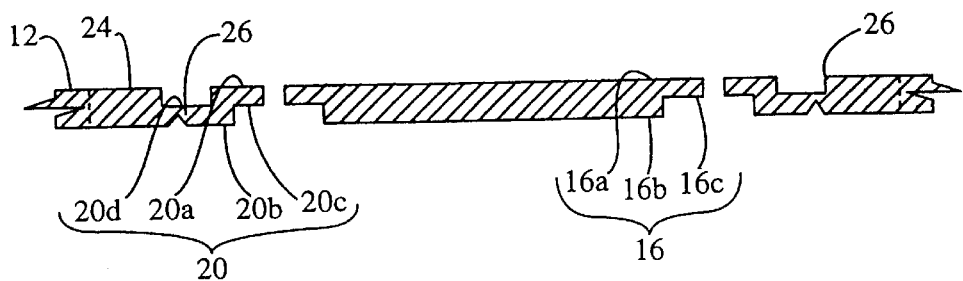
FIG. 3 is a cross-sectional view taken along line I—I of FIG. 1.
Figure 4:
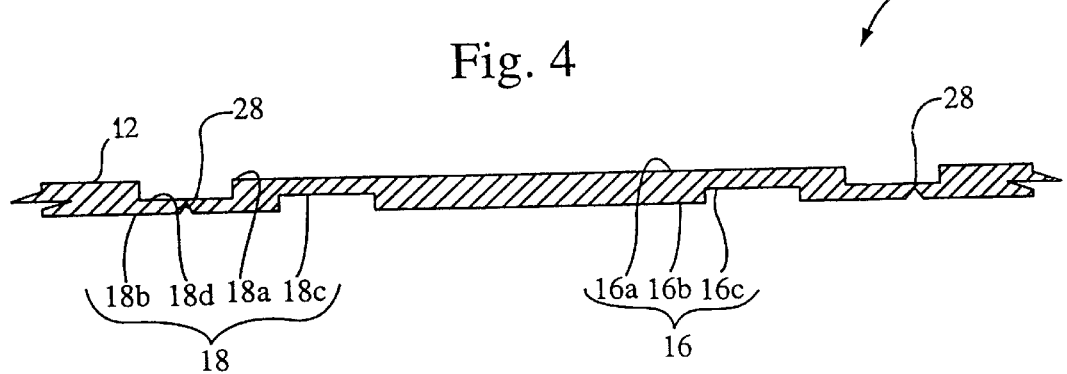
FIG. 4 is a cross-sectional view taken along line II—II of FIG. 1.

Referring now to FIGS. 3 and 4, the lead frame 10 is not fabricated to be of uniform thickness. In this regard, the regions represented as hatched lines in FIGS. 1 and 2 have a thinner thickness than that of the remainder of the frame 12, as will be described in more detail with reference to FIGS. 3 and 4.

As shown in FIGS. 3 and 4, the die pad 16 defines a substantially planar first surface 16a. In addition to the first surface 16a, the die pad 16 defines substantially planar second and third surfaces 16b, 16c which are opposed to the first surface 16a. The third surface 16c extends along the peripheral edge of the die pad 16 (i.e., the third surface 16c circumvents the second surface 16b), and is perpendicularly recessed or depressed relative to the second surface 16b.

As seen in FIG. 4, the tie bars 18 which connect the die pad 16 to the frame 12 also each define a substantially planar first surface 18a, as well as substantially planar second and third surfaces 18b, 18c which are opposed to the first surface 18a. The third surface 18c is defined on a portion of the tie bar 18 adjacent the die pad 16. That is, the third surface 18c is continuous with (i.e., co-planar to) the third surface 16c of the die pad 16. Each of the tie bars 18 further defines a substantially planar fourth surface 18d which is formed adjacent the frame 12. The fourth surface 18d of each of the tie bars 18 is depressed or recessed relative to the first surface 18a.

As shown in FIG. 3, each of the contacts 20 defines a substantially planar first surface 20a, and substantially planar second and third surfaces 20b, 20c which are opposed to the first surface 20a. The third surface 20c is located at the distal end of the contact 20 closer to the die pad 16 than the second surface 20b. Additionally, the third surface 20c is depressed or recessed relative to the second surface 20b. Each contact 20 further defines a substantially planar fourth surface 20d which is opposed to the second surface 20b and formed adjacent the corresponding dambar 10. The fourth surface 20d of each of the contacts 20 is also depressed or recessed relative to the first surface 20a.

As further seen in FIGS. 3 and 4, formed within the second surface 20b of each of the contacts 20 is a laterally extending notch or groove 26. Each notch 26 extends below the corresponding fourth surface 20d of the contact 20. Similarly, disposed in the second surface 18b of each tie bar 18 is a laterally extending notch or groove 28. The notch 28 extends below the corresponding fourth surface 18d of the tie bar 18. The notches 26, 28 each have wedge-shaped or triangular cross-sectional configurations, and are formed within the contacts 20 and tie bars 18 of the lead frame 10 via an etching process. The use of the notches 26, 28 will be described in more detail below.

The lead frame 10 is preferably manufactured from a metal material, such as copper or copper alloy. Additionally, the first surface 20a of each of the contacts 20 can be plated with gold, silver, nickel, palladium, or alloys thereof in a predetermined thickness. The lead frame 10 may be formed from rolled strip metal stock by wet chemical etching or mechanical stamping using progressive dies. Chemical etching (also known as chemical milling) is a process that uses photolithography and metal-dissolving chemicals to etch a pattern into a metal strip. The photoresist is exposed to ultraviolet light through a photo mask having a desired pattern, and is subsequently developed and cured. Chemicals are sprayed or otherwise applied to the masked strip, and exposed portions of the strip are etched away, leaving the desired pattern. Progressive stamping uses sets of progressive dies to mechanically remove metal from a metal strip. Each of a plurality of stamping stations uses one of the dies to punch a distinct small area of metal from the strip as the strip moves through the stations. The lead frame 12 can be formed by chemically etching the rolled strip metal stock from both sides using a conventional liquid etchant. The etch process is stopped early so that there is an underetching of various surfaces of the lead frame 10 as needed to achieve the desired cross-sectional configuration.

In the lead frame 10, a portion of each dambar 22 and each tie bar 18 is singulated to separate the chip package 100 from the frame 12 during a manufacturing step for the chip package 100. As will also be discussed in more detail below, those portions of the dambars 22 and tie bars 18 which are removed from the completed chip package 100 are those portions which are located outward of the notches 26, 28.

Those of ordinary skill in the art will recognize that the configuration of the lead frame 10 as shown and described with regard to FIGS. 1–4 is exemplary only, and may be varied according to the application field. In this regard, the contacts 20 can be suitably designed according to the number and position of input-output pads desired in the chip package 100. Additionally, though the lead frame 10 shown in FIGS. 1 and 2 has a square configuration, it may alternatively be rectangularly configured. Similarly, though the die pad 16 is shown in FIGS. 1 and 2 as being generally square, the same may also be provided in a generally rectangular configuration. Further, though the contacts 20 are shown as being formed in four separate sets around the entire periphery of the die pad 16, the contacts 20 may also be provided in only two sets extending along and in spaced relation to respective ones of only two of the peripheral edge segments of the die pad 16. Still further, the die pad 16 may be connected to the frame 12 through the use of only two tie bars 18 as opposed to the four tie bars 18 shown in FIGS. 1 and 2. The contacts 20 may also be formed directly on the frame 12 without necessarily forming the dambars 22 and supporting leads 24. Moreover, one or more of the contacts 20 can be directly connected to the die pad 16 to eliminate the need for the tie bars 18 altogether.

Figure 5:
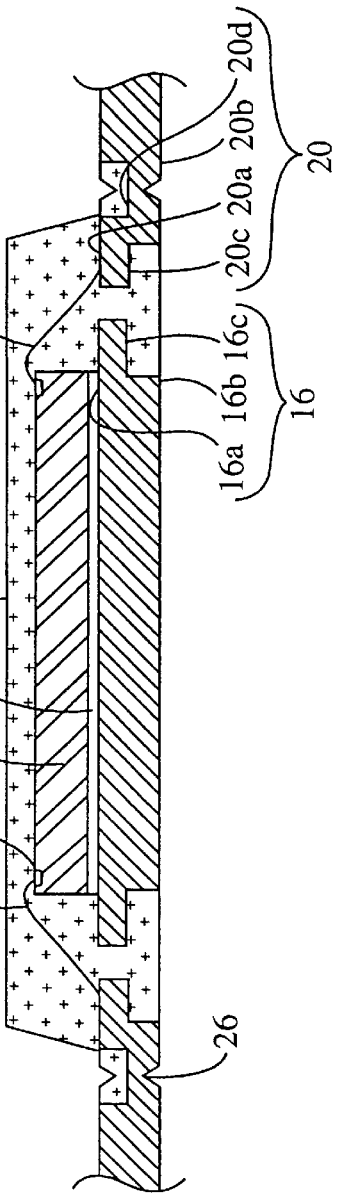
FIG. 5 is a cross-sectional view of the present chip package prior to the punch singulation thereof from the metal strip, illustrating the lead frame, package body, and integrated circuit die components of the chip package, the view of the lead frame being that which would be seen along line I—I of FIG. 1.
Figure 6:
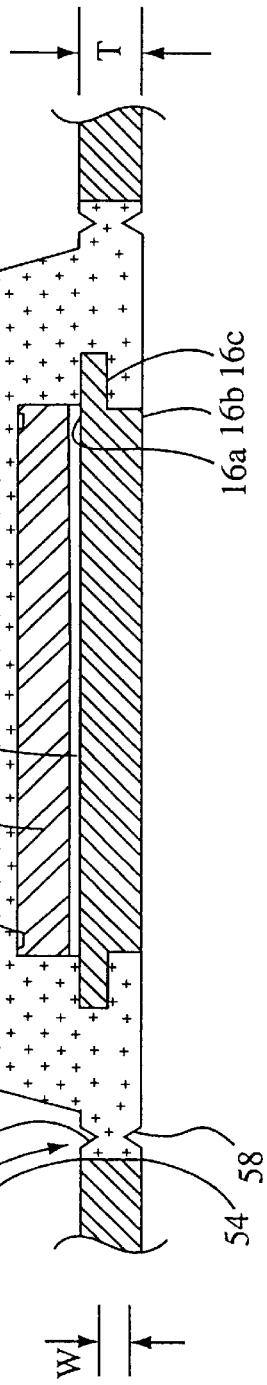
FIG. 6 is a cross-sectional view similar to FIG. 5, the view of the lead frame being that which would be seen along line III—III of FIG. 1.

Referring now to FIGS. 5 and 6, the chip package 100 further includes an integrated circuit die 30 which includes a plurality of input-output pads 32 disposed on an upper surface thereof. The die 30 is bonded to a first surface 16a of the die pad 16. Such bonding may be accomplished through the use of an epoxy, an adhesive film 33, or adhesive tape. In the chip package 100, the first surface 20a of each of the contacts 20 is mechanically and electrically connected to a respective one of the input-output pads 32 of the die 30. Such connection may be facilitated through the use of conductive wires 34, such as gold, copper, or aluminum wires. Thus, the electrical signals of the die 30 can be transmitted to a motherboard (not shown) via the conductive wires 34 and contacts 20. The conductive wires 34 and the contacts 20 may also be used to facilitate the transmission of electrical signals from the motherboard to the die 30.

In the chip package 100, the die pad 16, the die 30, the conductive wire(s) 34, and the contacts 20 are sealed with a sealing material, such as an epoxy molding compound. The hardened sealing material defines the package body 36 of the chip package 100. The package body 36 covers the die 30, the conductive wires 34, the first and third surfaces 16a, 16c of the die pad 16, and the first, third and fourth surfaces 20a, 20c, 20d of each of the contacts 20. The second surface 16b of the die pad 16, the second surface 20b of each of the contacts 20, and the second surface 18b of each of the tie bars 18 are not covered by the package body 36, and thus are exposed (see FIG. 12). Since they are exposed within the package body 36, the second surfaces 20b, 16b, 18b of the contacts 20, die pad 16, and tie bars 18, respectively, may be electrically connected to the motherboard through the use of solder or its equivalent.

Figure 7:
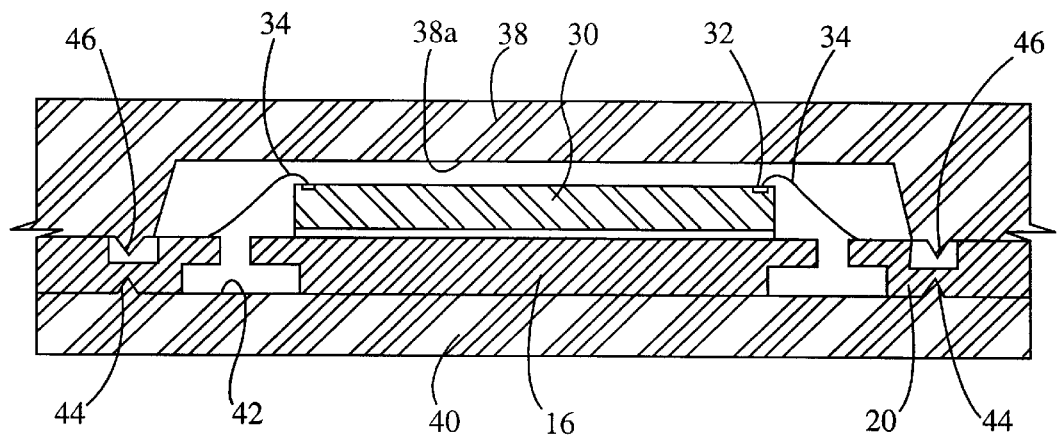
FIG. 7 is a cross-sectional view illustrating a mold used to facilitate the formation of the package body of the present chip package.
Figure 8:
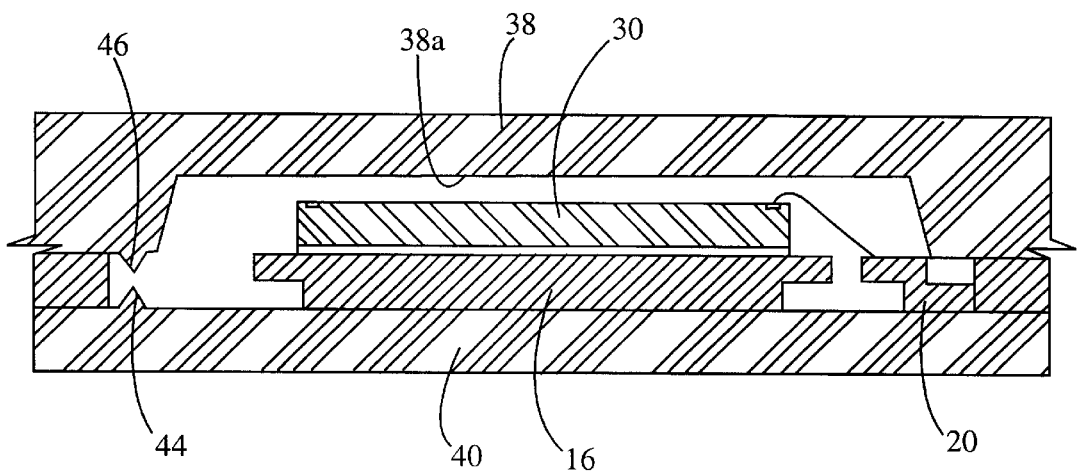
FIG. 8 is a cross-sectional view similar to FIG. 7 wherein some of the lead frame contacts have been removed solely for purposes of clearly illustrating the crease forming features of the mold.

Referring now to FIGS. 7 and 8, in the process of manufacturing the chip package 100, the formation of the package body 36 is accomplished through the use of an upper mold 38 which defines a cavity 38a having a predetermined volume, and a substantially flat lower mold 40. Subsequent to the bonding of the die 30 thereto and the completion of the wire bonding step described above, the lead frame 10 is loaded onto the lower mold 40. Thereafter, the upper mold 38 defining the cavity 38a is coupled to the lower mold 40. A sealing material is then injected into the cavity 38a at a high temperature under a high pressure to form the package body 36. The cavity 38a of the upper mold 38 communicates with the fourth surface 20d of each of the contacts 20 so that a sufficient amount of the sealing material is injected onto the fourth surfaces 20d to facilitate the complete formation of the package body 36.

As further seen in FIGS. 7 and 8, the lower mold 40 defines a top surface 42, and includes an integral lower mold protuberance 44 which extends upwardly from the top surface 42 and has a configuration which is complementary to that of the notches 26, 28 of the lead frame 10. Since the notches 26, 28 are preferably identically sized and each have a wedge-shaped or triangular cross-sectional configuration, the lower mold protrusion 44 also preferably has a wedge-shaped or triangular cross-sectional configuration. Though not apparent from FIGS. 7 and 8, the layout or orientation of the lower mold protrusion 44 on the top surface 42 mirrors that of the notches 26, 28 within the lead frame 10. In this regard, the lead frame 10 is loaded onto the lower mold 40 such that the lower mold protuberance 44 is advanced into and nested within the notches 26, 28. The lower mold protuberance 44 is continuous, and thus defines a total of eight sides so as to be capable of being nested within the notches 26, 28. More particularly, the lower mold protuberance 44 takes the general form of a square having four beveled corner regions. Since the lower mold protuberance 44 is continuous, it extends through those voids or spaces separating the contacts 20 from each other and certain ones of the contacts 20 from the tie bars 18. It will be recognized by those of ordinary skill in the art that the cross-sectional configuration of the lower mold protuberance 44 may be varied, with the sole requirement being that the same be complementary to the cross-sectional configuration of the notches 26, 28 so as to be advanceable thereinto. When the lower mold protuberance 44 is fully advanced into the notches 26, 28, the second surface 16b of the die pad 16, the second surfaces 20b of the contacts 20, and the second surfaces 18b of the tie bars 18 will be in direct, abutting contact with the top surface 42 of the lower mold 40.

The upper mold 38 itself is formed to include an integral upper mold protuberance 46. The cross-sectional configuration and size or layout of the upper mold protuberance 46 is preferably identical to that of the lower mold protuberance 44. Additionally, the upper mold protuberance 46 is oriented such that when the upper and lower mold sections 38, 40 are properly mated to the lead frame 10, the lower and upper mold protuberances 44, 46 will be disposed in opposed, spaced relation to each other. The preferred spacing between the distal tips of the lower and upper mold protuberances 44, 46 will be discussed in more detail below. As seen in FIG. 7, due to its orientation relative to the lower mold protuberance 44, the upper mold protuberance 46 is advanced into a recess included in each of the contacts 20 and partially defined by the fourth surface 20d thereof.

As indicated above, the cavity 38a of the upper mold 38 communicates with the fourth surface 20d of each of the contacts 20 so that a sufficient amount of the sealing material is injected onto the fourth surfaces 20d to facilitate the complete formation of the package body 36. The sealing material is also injected onto the fourth surface 18d of each of the tie bars 18. As such, the sealing material will flow about the upper mold protuberance 46 in its entirety. Additionally, the sealing material will flow about those portions of the lower mold protuberance 44 which are not nested within the notches 26, 28 of the contacts 20 and tie bars 18, respectively.

Upon the hardening of the sealing material, the upper and lower molds 38, 40 are separated from the resultant package body 36. As further seen in FIGS. 5 and 6, the fully formed package body 36 includes a central portion 48 which is circumvented by a peripheral portion 50 of substantially reduced thickness. The peripheral portion 50 itself defines opposed, generally planar top and bottom surfaces 52, 54. Disposed within the top surface 52 of the peripheral portion 50 is a top singulation crease 56 which is formed by the hardening of the sealing material about the upper mold protuberance 46. Similarly, formed in the bottom surface 54 of the peripheral portion 50 is a bottom singulation crease 58 which is partially formed by the flow of the sealing material about those portions of the lower mold protuberance 44 which are not nested within the notches 26, 28 of the lead frame 10. The bottom singulation crease 58 is collectively defined by a series of aligned crease segments which are formed within the bottom surface 54 of the peripheral portion 50 and the notches 26, 28 which are disposed between and aligned with such crease segments. Thus, the crease segments and notches 26, 28 essentially define a continuous bottom singulation crease. During the molding of the package body 36, since the second surface 16b of the die pad 16, the second surface 18b of each of the tie bars 18, and the second surface 20b of each of the contacts 20 directly contact the top surface 42 of the lower mold 40, such second surfaces 16b, 18b, 20b remain exposed in the completely formed chip package 100 as indicated above.

In the chip package 100, the top and bottom singulation creases 56, 58 are preferably formed to have a depth such that the peripheral portion 50 of the package body 36 has a web thickness W between the inner tips of the singulation creases 56, 58 which is approximately one-half the total thickness T of the lead frame 10. Stated another way, the peripheral portion 50 of the package body 36 has a body thickness B which is substantially equal to the lead frame thickness T. The web thickness W between the top and bottom singulation creases 56, 58 is preferably equal to approximately one-half the body thickness B. Those of ordinary skill in the art will recognize that the depths of the top and bottom singulation creases 56, 58 and hence the web thickness W therebetween may vary from those parameters described above. Additionally, the top and bottom singulation creases 56, 58 may be formed to have cross-sectional configurations other than for a triangular cross-sectional configuration. Of course, such modified cross-sectional configuration would entail varying the profiles of the lower and upper mold protuberances 44, 46 described above.

Additionally, though not shown, it is contemplated that the peripheral portion 50 of the package body 36 may be provided with a single, larger singulation crease as an alternative to the opposed top and bottom singulation creases 56, 58. It is further contemplated that such single singulation crease would be disposed within the top surface 52 of the peripheral portion 50. A preferred depth of such single singulation crease would be approximately one-half the total body thickness B of the peripheral portion 50 of the package body 36. The formation of a single singulation crease in the peripheral portion 50 would negate the need for the inclusion of the lower mold protuberance 44 on the lower mold 40, as well as the need to form the notches 26, 28 within the lead frame 10. The reason for the inclusion of such singulation crease in the top surface 52 of the peripheral portion 50 will be described in more detail below.

Figure 9:
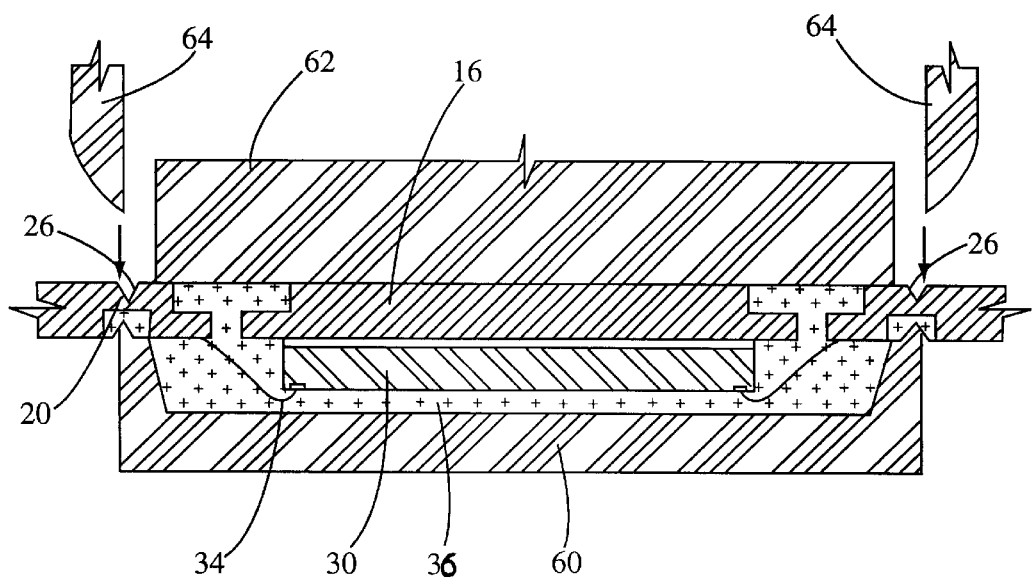
FIG. 9 is a cross-sectional view illustrating a punch singulation step used to facilitate the formation of the present chip package, the cross-sectional view of the lead frame, package body and integrated circuit die being the same as that shown in FIG. 5.
Figure 10:
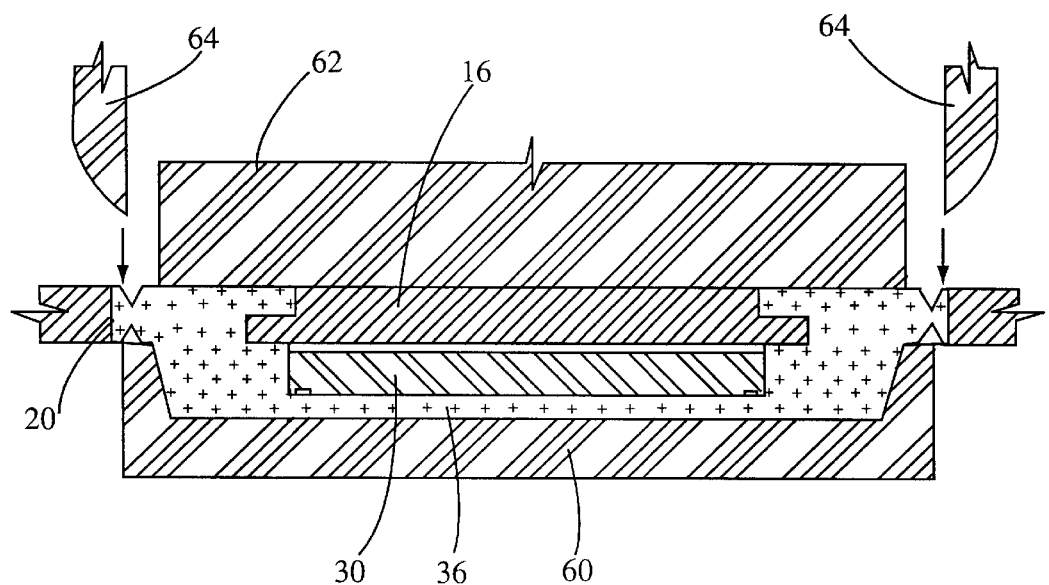
FIG. 10 is a cross-sectional view similar to FIG. 9, the cross-sectional view of the lead frame, package body and integrated circuit die being the same as that shown in FIG. 6.

Referring now to FIGS. 9 and 10, the punch singulation step in the manufacture of the chip package 100 is performed upon the completion of the sealing and plating processes discussed above. In the instance where the top and bottom singulation creases 56, 58 are included in the peripheral portion 50 of the package body 36, the punch singulation is preferably performed with the chip package 100 being inverted. The singulation step is carried out using a singulation device which includes a lower tool 60 adapted to receive the central portion 48 of the package body 36, an upper tool 62 adapted to fix the chip package 100 by clamping the same to the lower tool 60, and a punch 64 which singulates a prescribed region of the chip package 100, and more particularly those portions of the peripheral portion 50, contacts 20 and tie bars 18 which are disposed outward of the top and bottom singulation creases 56, 58. As indicated above, also removed in the punch singulation process are the dambars 22, supporting leads 24, and surrounding frame 12.

The punch 64 preferably initially impacts the bottom surface 54 of the peripheral portion 50 and second surfaces 20b, 18b to minimize burring of the singulated copper of the contacts 20 and tie bars 18. If, on the other hand, only the single singulation crease is formed in the top surface 52 of the peripheral portion 50, it follows that the punch 64 would initially impact the top surface 52. The single singulation crease is preferably formed in the top surface 52 so as to reduce or minimize any disturbance to those portions of the contacts 20 extending within the peripheral portion 50 of the package body 36. Advantageously, the singulation creases 56, 58 (or single singulation crease) provide a stress concentration line within the peripheral portion 50 of the package body 36 during the punch singulation process. As a result, less punch force is needed for the singulation step, with less mechanical stress being applied to the peripheral portion 50 of the package body 36. This reduction in mechanical stress substantially reduces chipping and cracking problems which often occur in relation to current punch singulation processes.

Figure 11:
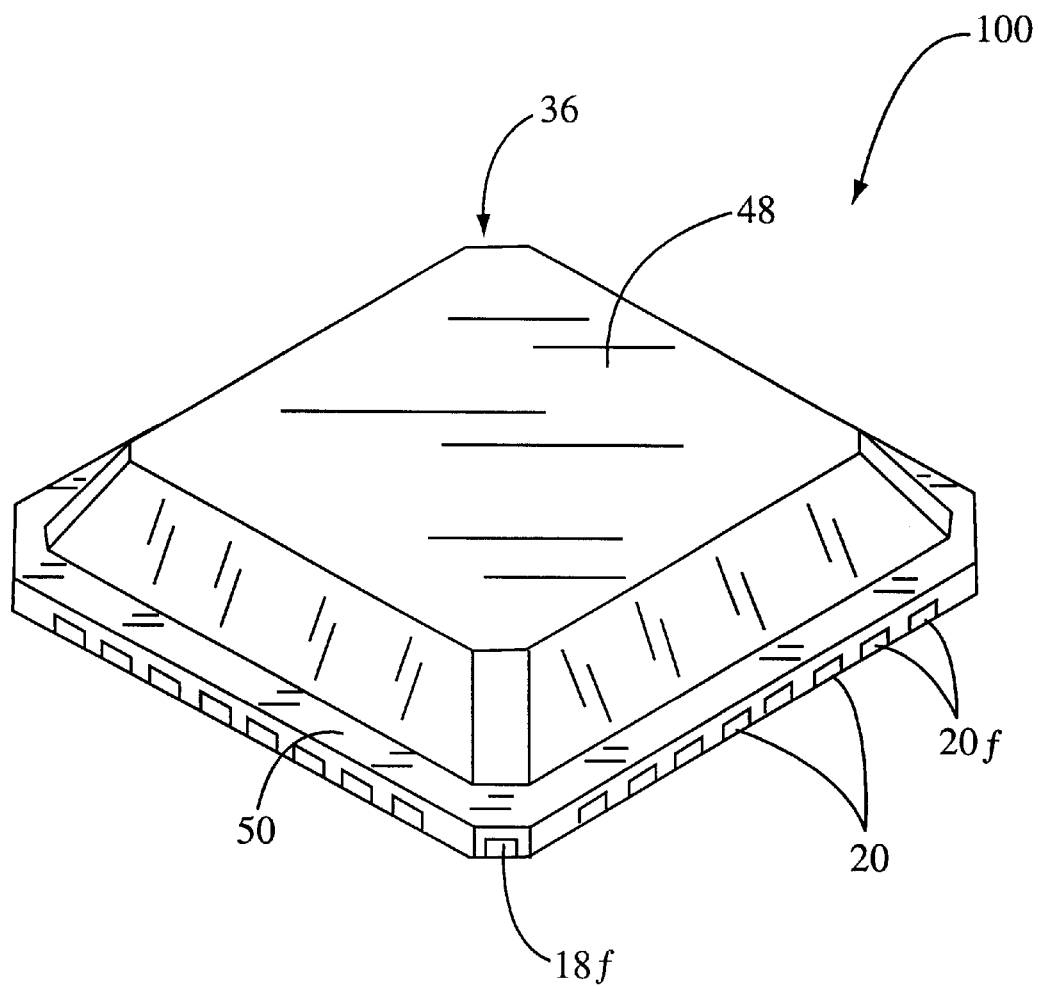
FIG. 11 is a top perspective view of the present chip package subsequent to the completion of the punch singulation step shown in FIGS. 9 and 10.
Figure 12:
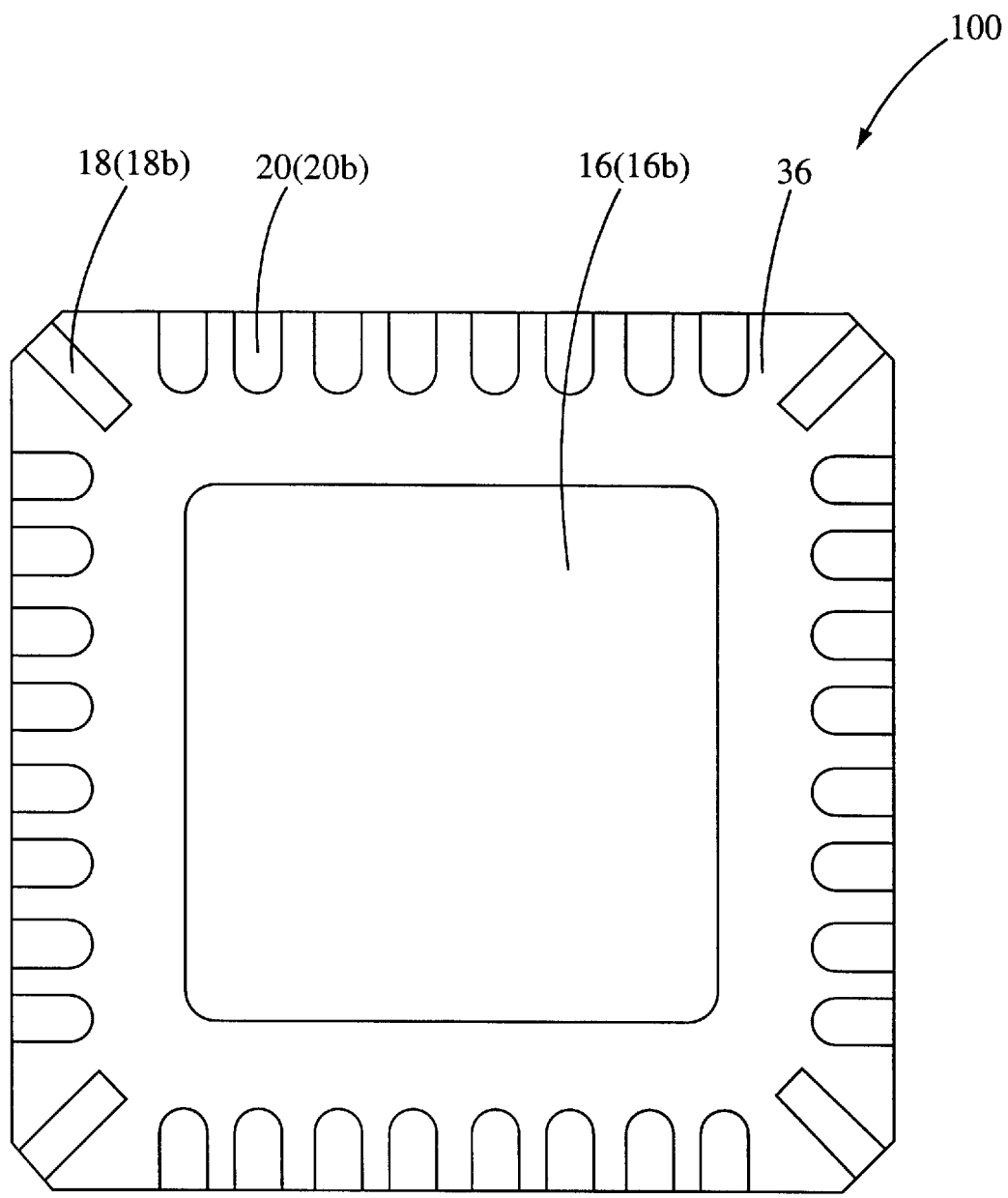
FIG. 12 is a bottom plan view of the chip package shown in FIG. 11.

Subsequent to the completion of the punch singulation process, the chip package 100 assumes the final configuration shown in FIGS. 11 and 12. In the completed chip package 100, each of the contacts 20 defines an exposed distal end 20f, with each of the tie bars 18 defining an exposed distal end 18f. It will be recognized by those of ordinary skill in the art that the singulation creases 56, 58 or single singulation crease described above, though being shown and described as being incorporated into a micro lead frame (MLF) chip package 100, may be used in alternative types of integrated circuit chip packages as well.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An integrated circuit chip package comprising:
   a leadframe including a plurality of contacts;
   an integrated circuit die electrically connected to the leadframe; and
   a package body partially encapsulating the leadframe and the integrated circuit die, the package body including:
      a central portion;
      a peripheral portion circumventing the central portion and defining opposed top and bottom surfaces, the contacts being partially exposed within the bottom surface of the peripheral portion; and
      top and bottom singulation creases disposed within respective ones of the top and bottom surfaces of the peripheral portion of the package body in opposed relation to each other, the bottom singulation crease being collectively defined by a plurality of singulation crease segments disposed within the bottom surface of the peripheral portion and the exposed surfaces of the contacts.

2. The chip package of claim 1 wherein:
   the leadframe further includes a plurality of tie bars which are partially exposed within the bottom surface of the peripheral portion of the package body; and
   the bottom singulation crease is collectively defined by a plurality of singulation crease segments disposed within the bottom surface of the peripheral portion and the exposed surfaces of the contacts and the tie bars.

3. The chip package of claim 1 wherein each of the singulation creases has a generally triangular cross-sectional configuration.

4. An integrated circuit chip package comprising:
   a leadframe including a plurality of contacts;
   an integrated circuit die electrically connected to the leadframe; and
   a package body partially encapsulating the leadframe and the integrated circuit die, the package body including:
      a central portion;
      a peripheral portion circumventing the central portion and defining opposed top and bottom surfaces, the contacts being partially exposed within the bottom surface of the peripheral portion; and
      means disposed within each of the top and bottom surfaces of the peripheral portion and the exposed surfaces of the contacts for forming a stress concentration line in the package body.

5. An integrated circuit chip package comprising:
   a leadframe having a frame thickness;
   an integrated circuit die electrically connected to the leadframe; and
   a package body partially encapsulating the leadframe and the integrated circuit die, the package body including:
      a central portion;
      a peripheral portion circumventing the central portion and defining opposed top and bottom surfaces; and
      top and bottom singulation creases disposed within respective ones of the top and bottom surfaces of the peripheral portion of the package body in opposed relation to each other, the peripheral portion having a web thickness between the singulation creases which is approximately one-half the frame thickness.

6. An integrated circuit chip package comprising:
   a leadframe;
   an integrated circuit die electrically connected to the leadframe; and
   a package body partially encapsulating the leadframe and the integrated circuit die, the package body including:
      a central portion;
      a peripheral portion circumventing the central portion and defining opposed top and bottom surfaces; and
      top and bottom singulation creases disposed within respective ones of the top and bottom surfaces of the peripheral portion of the package body in opposed relation to each other, the peripheral portion having a body thickness and a web thickness between the singulation creases which is approximately one-half the body thickness.

7. An integrated circuit chip package comprising:
   a leadframe;
   an integrated circuit die electrically connected to the leadframe; and
   a package body partially encapsulating the leadframe and the integrated circuit die, the package body including:

a central portion;

a peripheral portion circumventing the central portion and defining opposed top and bottom surfaces; and a singulation crease disposed in at least one of the, top and bottom surfaces of the peripheral portion of the package body and circumventing the central portion thereof.

8. The chip package of claim 7 wherein:

the peripheral portion of the package body has a body thickness; and the singulation crease has a depth which is approximately one-half the body thickness.

9. The chip package of claim 7 wherein the singulation crease is disposed in the top surface of the peripheral portion.

10. The chip package of claim 7 wherein the singulation crease has a generally triangular cross-sectional configuration.

11. The chip package of claim 7 wherein top and bottom singulation creases are disposed within respective ones of the top and bottom surfaces of the peripheral portion in opposed relation to each other.

12. The chip package of claim 11 wherein each of the singulation creases has a generally triangular cross-sectional configuration.

13. The chip package of claim 11 wherein the singulation crease includes at least four segments arranged in a generally square pattern.

14. An integrated circuit chip package comprising:

a leadframe;

an integrated circuit die electrically connected to the leadframe; and a package body partially encapsulating the integrated circuit die, the package body including:

a central portion;

a peripheral portion circumventing the central portion and defining opposed top and bottom surfaces; and means disposed within at least one of the top and bottom surfaces of the peripheral portion for forming a stress concentration line in the package body which circumvents the central portion thereof.

* * * * *